US010025652B2

(12) United States Patent
Bandic et al.

(10) Patent No.: US 10,025,652 B2
(45) Date of Patent: Jul. 17, 2018

(54) ERROR LOCATION POINTERS FOR NON VOLATILE MEMORY

(71) Applicant: HGST Netherlands B.V., Amsterdam (NL)

(72) Inventors: Zvonimir Z. Bandic, San Jose, CA (US); Kiran Kumar Gunnam, Milpitas, CA (US); Robert Eugeniu Mateescu, San Jose, CA (US); Minghai Qin, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 297 days.

(21) Appl. No.: 14/924,671

(22) Filed: Oct. 27, 2015

(65) Prior Publication Data

US 2017/0116060 A1    Apr. 27, 2017

(51) Int. Cl.
*G06F 11/07* (2006.01)

(52) U.S. Cl.
CPC ........ *G06F 11/079* (2013.01); *G06F 11/0727* (2013.01); *G06F 11/0751* (2013.01)

(58) Field of Classification Search
CPC ............... G06F 11/079; G06F 11/0727; G06F 11/0751; H04L 1/0057; G11C 29/44; G11C 2029/0411; G11C 29/52; H03M 13/09; G05B 2219/35278; G11B 27/034; G11B 27/105; G11B 2020/1222; G11B 2220/2516; G11B 2020/1836; G11B 20/18

See application file for complete search history.

(56) References Cited

U.S. PATENT DOCUMENTS

| 4,775,978 A | 10/1988 | Hartness |
| 8,365,015 B1 * | 1/2013 | Yu .......................... G06F 9/3863 714/16 |
| 8,645,795 B2 | 2/2014 | Ishihara et al. |
| 8,650,458 B2 | 2/2014 | Kim et al. |
| 8,769,374 B2 | 7/2014 | Franceschini et al. |

(Continued)

FOREIGN PATENT DOCUMENTS

| EP | 1815338 A2 | 8/2010 |
| WO | 2014/167535 A3 | 2/2015 |
| WO | 2015/020900 A2 | 2/2015 |

*Primary Examiner* — Phung M Chung
(74) *Attorney, Agent, or Firm* — Patterson & Sheridan, LLP; Steven Versteeg

(57) ABSTRACT

Embodiments of the present disclosure generally relate to an improved method and system for error correction in non-volatile memory cells. The method includes writing data to a first location in non-volatile memory from a block of user data stored in DRAM and verifying the written data matches the block of user data. If the written data fails verification, the method further includes writing an error location pointer indicative of one or more error locations in the first location to a second location in non-volatile memory. Writing the one or more error locations to the error location pointer includes verifying the written error location pointer matches an address of the one or more error locations in the first location to ensure integrity of the error location pointer. Use of the error location pointer results in non-volatile memory with increased data rate, decreased read latency and a low probability of data loss.

17 Claims, 6 Drawing Sheets

(56) References Cited

U.S. PATENT DOCUMENTS

| | | | |
|---|---|---|---|
| 8,850,297 B1 | 9/2014 | Steiner et al. | |
| 8,990,657 B2 | 3/2015 | Moyer | |
| 2004/0190357 A1* | 9/2004 | Scheuerlein | G11C 7/1006 |
| | | | 365/222 |
| 2005/0044459 A1* | 2/2005 | Scheuerlein | G11C 7/1006 |
| | | | 714/719 |
| 2012/0159281 A1* | 6/2012 | Shalvi | G06F 11/1044 |
| | | | 714/755 |
| 2014/0143636 A1 | 5/2014 | Frost et al. | |
| 2014/0208156 A1* | 7/2014 | Muralimanohar | G11C 5/04 |
| | | | 714/6.24 |
| 2014/0359395 A1* | 12/2014 | Ellis | G06F 11/1016 |
| | | | 714/763 |

\* cited by examiner

ERROR LOCATION POINTERS FOR NON VOLATILE MEMORY

BACKGROUND OF THE DISCLOSURE

Field of the Disclosure

Embodiments of the present disclosure generally relate to an improved method and system for error correction in non-volatile memory cells.

Description of the Related Art

The performance of non-volatile memory (NVM) is limited by the raw bit error rate of NVM cells. Phase change memory (PCM) is a type of non-volatile memory in which reading occurs much faster than writing. The write noise may introduce errors, such that the actual bit-value stored in the NVM is not what was intended. For example, an intended bit-value of 0 might be inadvertently flipped to an incorrect bit-value of 1. Correcting write errors is essential in increasing the lifetime and in assuring the data integrity of NVM cells.

Various conventional error correction schemes are available to address such write errors. Oftentimes error correction codes (ECCs), for example BCH codes, are used to detect and correct write errors. However, conventional error correction codes result in decreased data rate and increased read latency because of the decoding complexity involved.

Therefore, there is a need in the art for an improved method and system for error correction in non-volatile memory cells.

SUMMARY OF THE DISCLOSURE

Embodiments of the present disclosure generally relate to an improved method and system for error correction in non-volatile memory cells. The method includes writing data to a first location in non-volatile memory from a block of user data stored in DRAM and verifying the written data matches the block of user data. If the written data fails verification, the method further includes writing an error location pointer indicative of one or more error locations in the first location to a second location in non-volatile memory. Writing the one or more error locations to the error location pointer includes verifying the written error location pointer matches an address of the one or more error locations in the first location to ensure integrity of the error location pointer. Use of the error location pointer results in non-volatile memory with increased data rate, decreased read latency and a low probability of data loss.

In one embodiment, an error correction method for non-volatile memory is disclosed. The error correction method includes writing data to a first location in the non-volatile memory from a block of user data stored in DRAM and verifying that the written data matches the block of user data stored in DRAM. If the written data fails verification, the error correction method further includes writing an error location pointer indicative of one or more error locations in the first location to a second location in the non-volatile memory. The writing of the one or more error locations to the error location pointer includes verifying that the written error location pointer matches an address of the one or more error locations in the first location to ensure integrity of the error location pointer.

In another embodiment, a non-transitory computer readable storage medium storing a program is disclosed. When executed by a processor, the non-transitory computer readable storage medium performs an operation for correcting errors in non-volatile memory. The operation includes writing data to a first location in the non-volatile memory from a block of user data stored in DRAM and verifying that the written data matches the block of user data stored in DRAM. If the written data fails verification, the error correction method further includes writing an error location pointer indicative of one or more error locations in the first location to a second location in the non-volatile memory. The writing of the one or more error locations to the error location pointer includes verifying that the written error location pointer matches an address of the one or more error locations in the first location to ensure integrity of the error location pointer.

In another embodiment, a system is disclosed. The system includes a processor and a memory. The memory includes an application program configured to perform an operation for correcting errors in non-volatile memory. The operation includes writing data to a first location in the non-volatile memory from a block of user data stored in DRAM and verifying that the written data matches the block of user data stored in DRAM. If the written data fails verification, the operation further includes writing an error location pointer indicative of one or more error locations in the first location to a second location in the non-volatile memory. The writing of the one or more error locations to the error location pointer includes verifying that the written error location pointer matches an address of the one or more error locations in the first location to ensure integrity of the error location pointer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
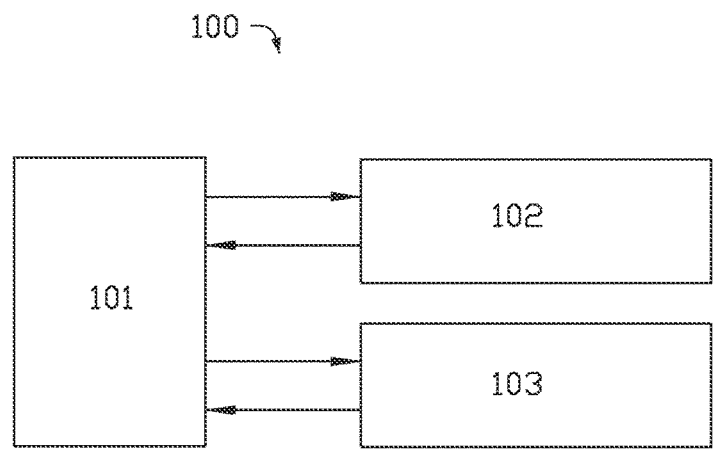
FIG. 1 is an example of a data storage system according to one embodiment described herein.

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

As will be appreciated by one of ordinary skill in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized for storing a program product which, when executed, is configured to perform a method for scheduling a preventative maintenance event. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, radio, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present disclosure may be written in any combination of one or more programming languages. The computer program instructions may be loaded onto a programmable data processing apparatus to cause a series of operational steps to be performed on the apparatus or other devices to produce a computer implemented process such that the instructions which execute on the programmable apparatus which provide processes for implementing the functions/acts specified in the flowchart and/or block diagram block or blocks.

Embodiments of the present disclosure generally relate to an improved method and system for error correction in non-volatile memory cells. The method includes writing data to a first location in the non-volatile memory from a block of user data stored in DRAM and verifying that the written data matches the block of user data stored in DRAM. If the written data fails verification, the error correction method further includes writing an error location pointer indicative of one or more error locations in the first location to a second location in the non-volatile memory. The writing of the one or more error locations to the error location pointer includes verifying that the written error location pointer matches an address of the one or more error locations in the first location to ensure integrity of the error location pointer. Use of the error location pointer results in non-volatile memory with increased data rate, decreased read latency and a low probability of data loss.

FIG. 1 is an example of a data storage system 100 according to one embodiment described herein. The data storage system 100 may be non-volatile. That is, the data storage system 100 may be long term and persistent. The data storage system 100 may have solid state memory, such as a solid state drive, or contain magnetic media, such as a traditional hard disk drive. Some classes of the solid state drives include dynamic random-access memory (DRAM), magnetoresistive RAM (MRAM), phase change memory (PCM), or ferroelectric RAM (F-RAM). The data storage system 100 includes a control circuit 101, a first memory circuit 102, and a second memory circuit 103. The control circuit 101 may be a memory control unit, a processor circuit, or any other type of control circuit. In one embodiment, the first memory circuit 102 may be a data circuit and the second memory circuit 103 may be an error location circuit. The control circuit 101, first memory circuit 102, and second memory circuit 103 may be in the same integrated circuit or in separate integrated circuits. Thus, data storage system 100 may be a single integrated circuit device that includes circuits 101-103, or data storage system 100 may include three or more separate, integrated circuit devices 101-103.

Figure 2:
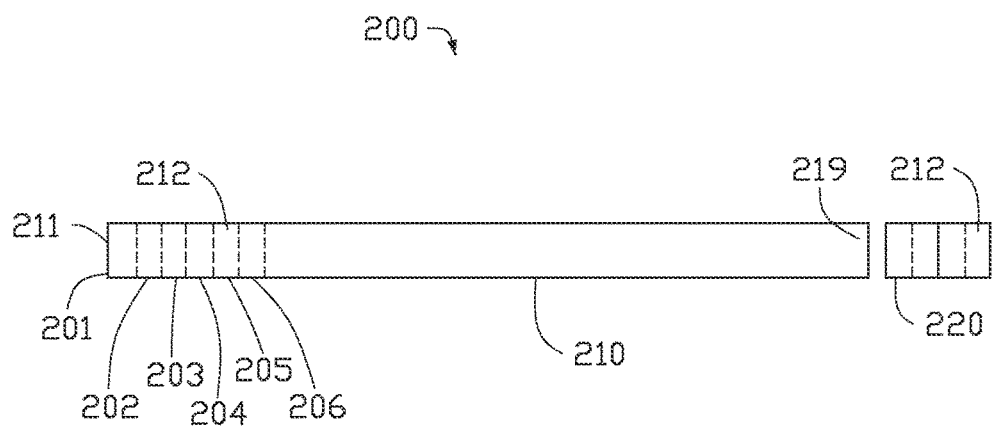
FIG. 2 is a storage architecture for the memory circuits of the data storage system according to one embodiment described herein.

FIG. 2 is a storage architecture for the memory circuits 102-103 of the data storage system 100. The storage architecture illustrates a block 200 of NVM corresponding to a unit for a single write of memory. The block 200 may have writable bits 212 or sectors. The bits 212 may be written with a value of '0' or a value of '1'. Alternately, the value of the bits 212 may be erased, i.e., neither a '0' nor a '1'. A plurality of bits 212 may form a data sector 210 in the block 200. The data sector 210 may have 8 k or more bits 212. The bits 212 in the data sector 210 may be incrementally numbered from a beginning 211 to an end 219 of the data sector. For example, the bit 212 in a first sector 201 would have an index number of '1', the bit 212 in a second sector 202 would have an index number of '2', the bit 212 in a third sector 203 would have an index number of '3', and so on for a fourth, fifth and sixth sectors 204, 205, 206 until the end 219 of the data sector 210 is reached. In one embodiment, a write operation assigns a '0' or a '1' to each bit 212 in the data sector 210. Writes smaller than the length of the data sector 210, i.e., having less bits than the total amount of bits 212 in the data sector 210, may optionally pad the write with '0' to fill all the bits in the data sector 210 to the end 219 of the data sector 210. The block 200 may also optionally have an error correcting code (ECC) sector 220. The ECC sector 220 has a plurality of bits 212 which are configured to store values of '0' and '1'. The number of bits 212 in the ECC sector 220 may be dependent on the error checking scheme used. For example, in a BCH error checking scheme suitable for correcting 1 error, the number of bits 212 in the ECC sector 220 includes 4 parity check bits for a block 200 having 15 bits. In one embodiment, the ECC sector 220 may have zero bits 212 and parity bits may be stored in the data sector 210 for error checking.

The longer the block 200 length, the greater the number of bits 212 and the greater the raw bit error rate (RBER). In one embodiment, the data storage system 100 utilizes first memory circuit 102 containing phase-change memory (also known as PCM, PCME, PRAM, PCRAM, Ovonic Unified Memory, Chalcogenide RAM and C-RAM). In PCM memory, reads can be performed very quickly but writes are slower. For example, the reading of a block of memory may take as little as $\frac{1}{50}^{th}$ the time for writing the same block of memory. Additionally, the RBER for PCM memory is very low, such as on the order of $10e^{-5}$ or $10e^{-6}$. Therefore, all the space allocated in memory for error detection, such as ECC sector 220 or other conventional schemes for error correction, is not required. The low raw bit error rate and the short block length used in PCM memory means that most blocks are essentially error-free, i.e., low RBER. Thus, the complicated error correction schemas, such BCH codes, are not necessary due to the low RBER.

Reading a sector takes much less time than writing a sector, so we can take advantage of the fast reading by reading a sector after writing a sector to discover any bits written in error without encroaching in on the write latency. We can use a cyclic redundancy check to determine if any uncorrectable errors exist in the written sector. If there is one error or less in the sector, the data can be recovered fast and accurately by implementing a Hamming code. Otherwise, in the scenarios where there is more than one error in the written block, the addresses of the one or more error locations from the first write are written to a redundancy sector, i.e., a separate and different location than the first write. In one embodiment, data message is written to NVM, such as PCM and read for errors. After determining there is a write error, the addresses of the one or more error locations are written to a different location in the memory.

Figure 3:
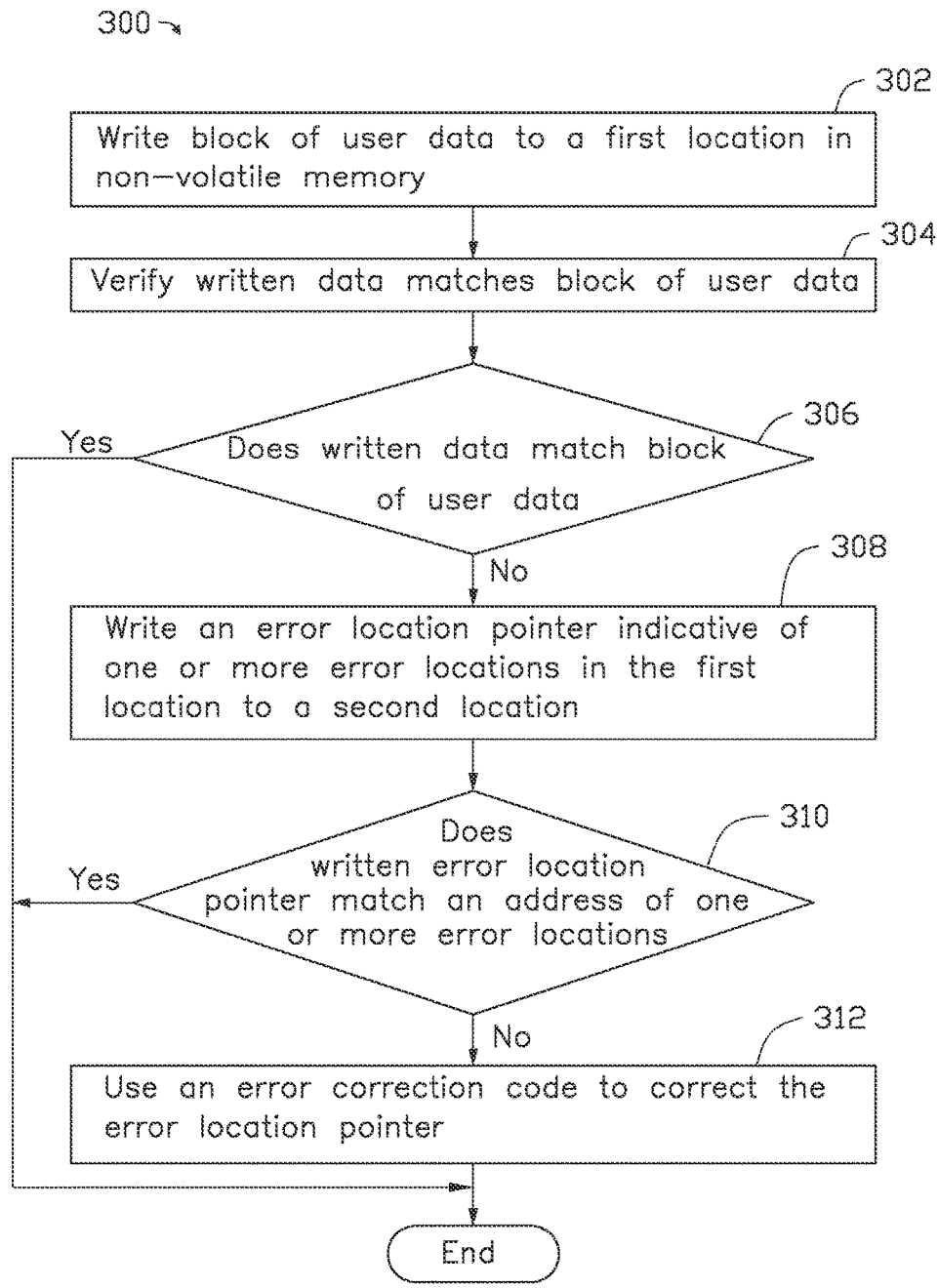
FIG. 3 is a flow chart for an error correction method for non-volatile memory according to one embodiment described herein.

FIG. 3 is a flow chart for an error correction method 300 for non-volatile memory according to one embodiment described herein. At block 302, data is written to a first location in non-volatile memory. In one embodiment, the first location is a first memory circuit. At block 304 the written data is verified. A determination 306 is made as to whether the written data matches the block of user data. If the written data does match the block of user data, no further steps need to be taken.

Figure 4:
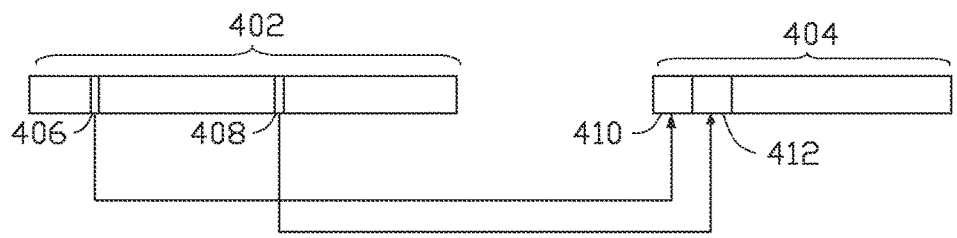
FIG. 4 illustrates an example of a data sector and an error location pointer repository according to one embodiment described herein.
Figure 5:
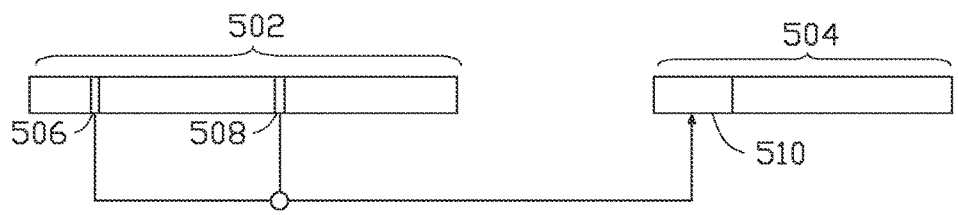
FIG. 5 illustrates an example of a data sector and an error location pointer repository according to another embodiment described herein.

If, however, the written data does not match the block of user data, at block 308, an error location pointer indicative of one or more error locations in the first location is written to a second location. As shown in FIG. 4, in one embodiment, the one or more error locations in the first location are written to the error location pointer in the second location individually. As shown in FIG. 5, in another embodiment, the one or more error locations in the first location are written to the error location pointer in the second location jointly. In one embodiment, the second location is a second memory circuit. A determination 310 is made as to whether the written error location pointer matches an address of the one or more error locations. In one embodiment, a cyclic redundancy check is used to verify the written error location pointer. If the written error location pointer does match an address of the one or more error locations, no further steps need to be taken. The verified error location pointer may be used to identify the address of the one or more error locations in the written data. Subsequently, during read operations, the bit value at the identified one or more error locations may be inverted (e.g., "0" to "1", or "1" to "0").

Figure 6:
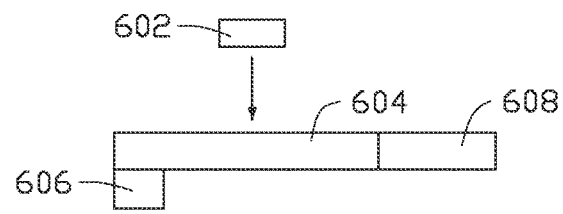
FIG. 6 illustrates a data sector, an error location pointer repository, a cyclic redundancy check and an error correction code according to one embodiment described herein.

If, however, the written error location pointer does not match an address of the one or more error locations, at block 312, an error correction code is used to correct the written location pointer as shown in FIG. 5. In one embodiment, the error correction code may be a BCH code. In another embodiment, the error correction code may be any other systematic error correction code. In yet another embodiment, multiple sectors of error locations pointers may be combined to correct the written error location pointer as shown in FIG. 6. Once the error location pointer has been verified, it may be used to identify the address of the one or more error locations in the written data. Subsequently, during read operations, the bit value at the identified one or more error locations may be inverted (e.g., "0" to "1", or "1" to "0").

FIG. 4 illustrates an example of a data sector 402 and an error location pointer repository 404 according to one embodiment described herein. In one embodiment, the data sector 402 has a size of 8 k, while the error location pointer repository 404 has a size of T $\log_2(8\,k)$. The data sector 402 includes a one or more error locations 406 and 408. As described in FIG. 3, in operation, the addresses of error locations 406 and 408 are written to the error location pointer repository 404. The address of error location 406 is written to error location pointer 410 in the error location pointer repository and the address of error location 408 is written to error location pointer 412 in the error location pointer repository. In other words, the addresses of error locations 406 and 408 are written to the error location pointer repository 404 individually. In one embodiment, the error location pointer repository 404 is a second memory circuit of a data storage system. In a further embodiment, the error location pointer repository 404 is a second location of a data storage system.

FIG. 5 illustrates an example of a data sector 502 and an error location pointer repository 504 according to another embodiment described herein. In one embodiment the data sector 502 has a size of 8 k, while the error location pointer repository 504 has a size of $\log_2(\Sigma_{i=0}^{T}(_i^{8k}))$. The data sector 502 includes one or more error locations 506 and 508. As described in FIG. 3, in operation, the addresses of the error locations 506 and 508 are written to the error location pointer repository 504. The addresses of error locations 506 and 508 are written to error location pointer 510 in the error location pointer repository 504. In other words, the addresses of error locations 506 and 508 are written to the error location pointer repository 504 jointly. In one embodiment, the error location pointer repository 504 is a second memory circuit of a data storage system. In a further embodiment, the error location pointer repository 504 is a second location of a data storage system.

FIG. 6 illustrates an example of a data sector 602, an error location pointer repository 604, a cyclic redundancy check 606 and an error correction code 608 according to one embodiment described herein. As described in FIG. 3, in operation, a block of user data is written to the data sector 602. The data sector 602 is then verified by comparing whether the data sector 602 matches the block of user data. If the data sector 602 is verified, no further steps need to be taken. If, however, the data sector 602 fails verification, then the error locations of the data sector 602 are written to error location pointers on the error location pointer repository 604. The error location pointer repository 604 is then verified by comparing the error location pointer repository 604 to the addresses of the one or more error locations of the data sector 602. In one embodiment, the error location pointer repository 604 is verified using a cyclic redundancy check 606. If the error location pointer repository 604 is verified, it may be used to identify the address of the one or more error locations in the written data. Subsequently, during read operations, the bit value at the identified one or more error locations may be inverted (e.g., "0" to "1", or "1" to "0"). If, however, the error location pointer repository 604 fails verification, then the error correction code 608 is used to correct the error in the error location pointer repository 604. Once the error location pointer repository 604 has been corrected, it may be used to identify the address of the one or more error locations in the written data. Subsequently, during read operations, the bit value at the identified one or more error locations may be inverted (e.g., "0" to "1", or "1" to "0").

Figure 7:
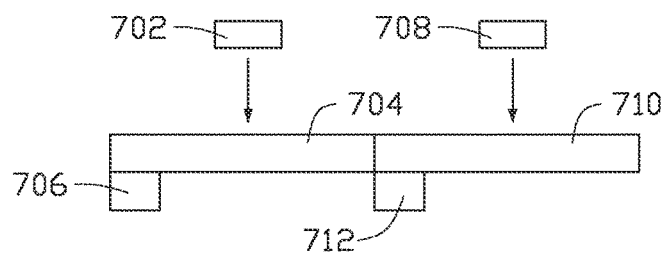
FIG. 7 illustrates a plurality of data sectors, error location pointer repositories and cyclic redundancy checks according to one embodiment described herein.

FIG. 7 illustrates a plurality of data sectors 702 and 708, error location pointer repositories 704 and 710, and cyclic redundancy checks 706 and 712 according to one embodiment described herein. As described in FIG. 3, in operation, blocks of user data are written to the data sectors 702 and 708. The data sectors 702 and 708 are then verified by comparing whether the data sectors 702 and 708 match the blocks of user data. If the data sectors 702 and 708 are verified, no further steps need to be taken. If, however, the data sectors 702 and 708 fail verification, then the error locations of the data sectors 702 and 708 are written to error location pointers on the error location pointer repositories 704 and 710. The error location pointer repositories 704 and 710 are then verified by comparing the error location pointer repositories 704 and 710 to the addresses of the one or more error locations of the data sectors 702 and 708. In one embodiment, the error location pointer repositories 704 and 710 are verified by cyclic redundancy checks 706 and 712. In other words, cyclic redundancy checks 706 and 710 are performed at the end of each of the error location pointer repositories 704 and 710. In another embodiment, more than two data sectors, error location pointer repositories and cyclic redundancy checks may be used.

Figure 8A:
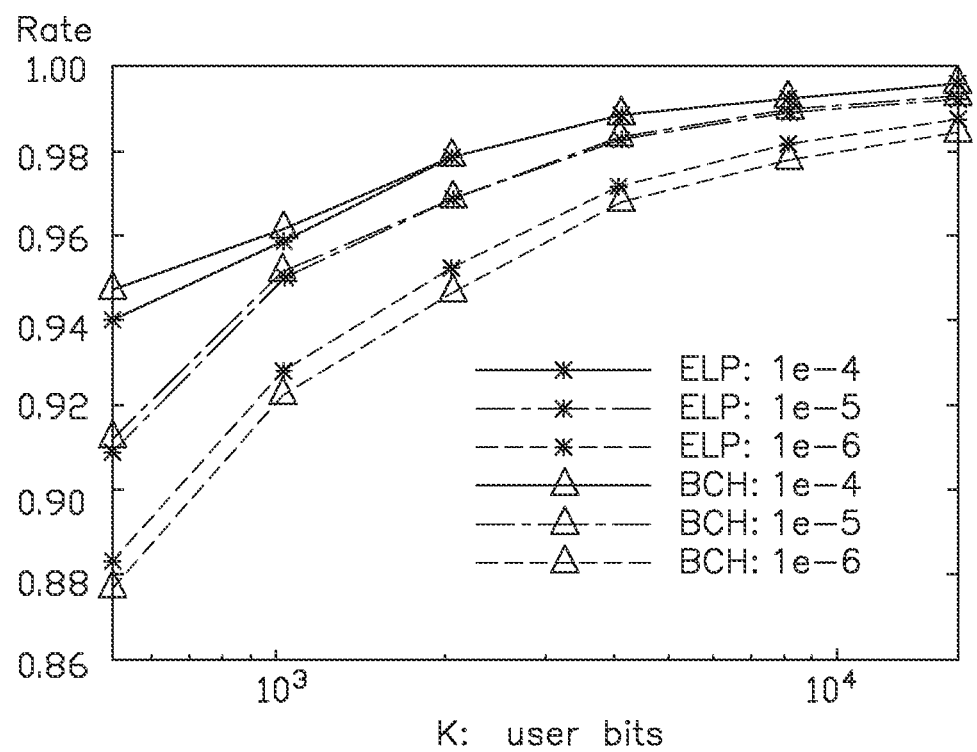
FIGS. 8A-8C are graphs illustrating properties of data storage systems using error location pointers according to one embodiment described herein.
Figure 8B:
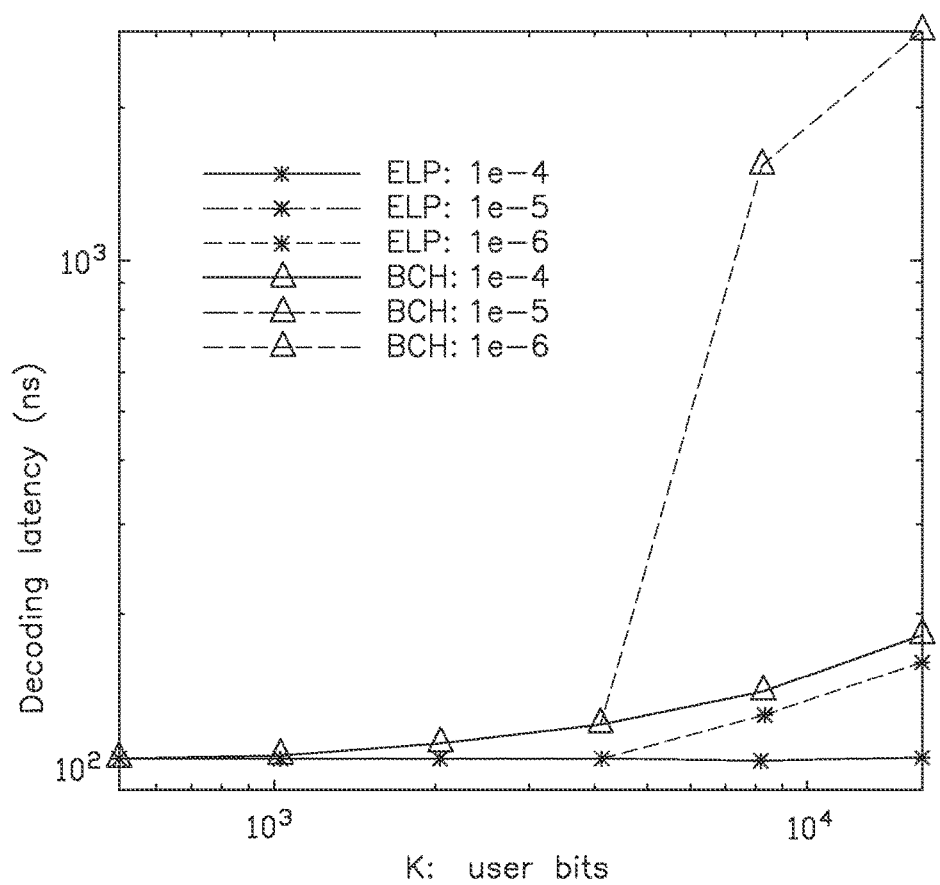
Figure 8C:
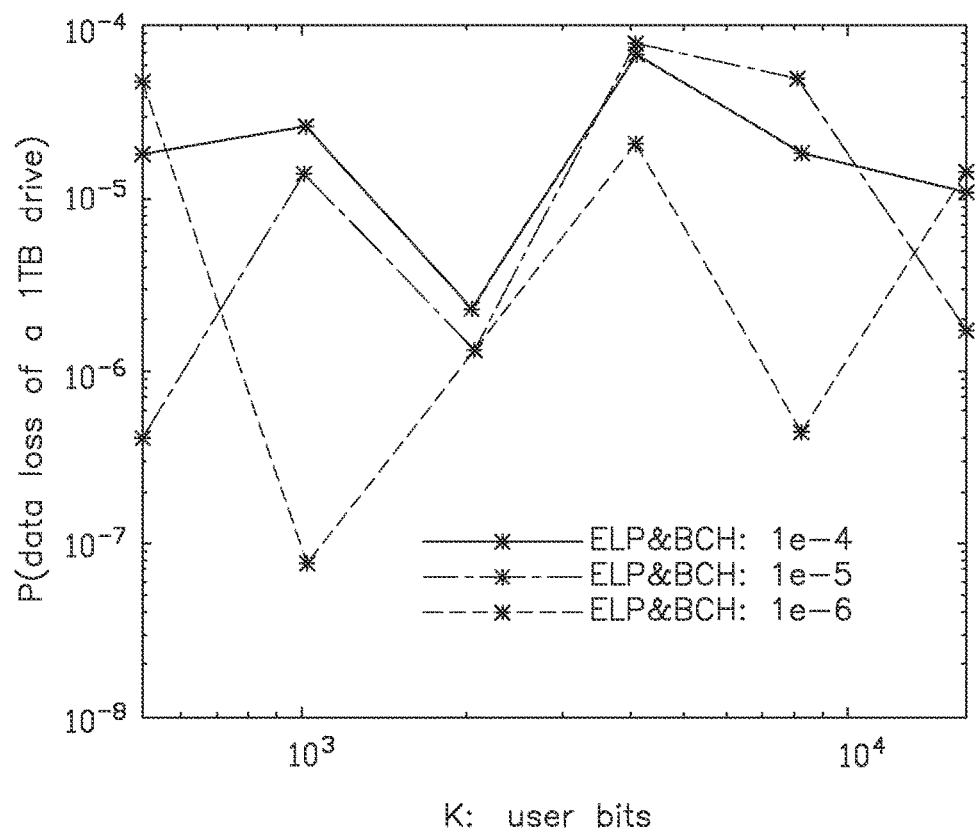

FIGS. 8A-8C are graphs illustrating properties of data storage systems using error location pointers according to one embodiment described herein. In FIG. 8A, an X-axis represents the number of user bits in the block of user data and a Y-axis represents the data rate at which the bits are read. In FIG. 8B, an X-axis represents the number of user bits in the block of user data and a Y-axis represents read latency. In FIG. 8C, an X-axis represents the number of user bits in the block of user data and a Y-axis represents the amount of data loss. As shown in FIG. 8A, data storage systems in which an error location pointer is used exhibit increased data rates as compared to data storage systems in which BCH codes are used. As shown in FIG. 8B, data storage systems in which an error location pointer is used exhibit decreased read latency as compared to data storage systems in which BCH codes are used. As shown in FIG. 8C, data storage systems using error location pointers exhibit the same or similar amount of data loss as data storage systems in which BCH codes are used.

In summary, a method and system for correcting errors in non-volatile memory are disclosed. The method includes writing the one or more error locations to an error location pointer. Once verified, the error location pointer may be used to identify the address of the one or more error locations in the written data. Then, during read operations, the bit value at the identified one or more error locations may be inverted (e.g., "0" to "1", or "1" to "0"). By using the error location pointer, the data rate may be increased, the read latency may be decreased and the probability of data loss is lowered.

While the foregoing is directed to embodiments of the present disclosure, other and further embodiments of the disclosure may be devised without departing from the basic scope thereof, and the scope thereof is determined by the claims that follow.

What is claimed is:

1. An error correction method for non-volatile memory, comprising:
   writing data to a first location in the non-volatile memory from a block of user data stored in DRAM;
   verifying that the written data matches the block of user data stored in DRAM; and
   if the written data fails verification, writing an error location pointer indicative of one or more error locations in the first location to a second location in the non-volatile memory, wherein the writing of the one or more error locations to the second location includes verifying that the written error location pointer matches an address of the one or more error locations in the first location to ensure integrity of the error location pointer wherein verifying that the written error location pointer matches an address of the one or more error locations in the first location comprises a cyclic redundancy check.

2. The method of claim 1, further comprising:
   if the written error location pointer fails verification, using an error correction code to decode the error location pointer.

3. The method of claim 1, wherein the one or more error locations in the first location are written to the error location pointer in the second location jointly.

4. The method of claim 1, wherein the one or more error locations in the first location are written to the error location pointer in the second location individually.

5. The method of claim 4, wherein verifying that the written error location pointer matches an address of the one or more error locations in the first location comprises a cyclic redundancy check.

6. The method of claim 4, further comprising:
   if the written error location pointer fails verification, using an error correction code to decode the error location pointer.

7. A non-transitory computer readable storage medium storing a program, which, when executed by a processor performs an operation for correcting errors in non-volatile memory, the operation comprising:
   writing data to a first location in the non-volatile memory from a block of user data stored in DRAM;
   verifying that the written data matches the block of user data stored in DRAM; and if the written data fails verification, writing an error location pointer indicative of one or more error locations in the first location to a second location in the non-volatile memory, wherein writing of the one or more error locations to the second location includes verifying that the written error location pointer matches an address of the one or more error locations in the first location to ensure integrity of the error location pointer wherein verifying that the written error location pointer matches an address of the one or more error locations in the first location comprises a cyclic redundancy check.

8. The non-transitory computer readable storage medium of claim 7, further comprising:
if the written error location pointer fails verification, using an error correction code to decode the error location pointer.

9. The non-transitory computer readable storage medium of claim 7, wherein the one or more error locations in the first location are written to the error location pointer in the second location jointly.

10. The non-transitory computer readable storage medium of claim 7, wherein the one or more error locations in the first location are written to the error location pointer in the second location individually.

11. The non-transitory computer readable storage medium of claim 10, wherein verifying that the written error location pointer matches an address of the one or more error locations in the first location comprises a cyclic redundancy check.

12. The non-transitory computer readable storage medium of claim 10, further comprising:
if the written error location pointer fails verification, using an error correction code to decode the error location pointer.

13. A system, comprising:
a processor; and
a memory, wherein the memory includes an application program configured to perform an operation for correcting errors in non-volatile memory, the operation comprising:
writing data to a first location in the non-volatile memory from a block of user data stored in DRAM;
verifying that the written data matches the block of user data store in DRAM; and
if the written data fails verification, writing an error location pointer indicative of one or more error locations in the first location to a second location in the non-volatile memory, wherein writing of the one or more error locations to the second location includes verifying that the written error location pointer matches an address of the one or more error locations in the first location to ensure integrity of the error location pointer wherein verifying that the written error location pointer matches an address of the one or more error locations in the first location comprises a cyclic redundancy check.

14. The system of claim 13, further comprising:
if the written error location pointer fails verification, using an error correction code to decode the error location pointer.

15. The system of claim 13, wherein the one or more error locations in the first location are written to the error location pointer in the second location jointly.

16. The system of claim 13, wherein the one or more error locations in the first location are written to the error location pointer in the second location individually.

17. The system of claim 16, further comprising:
if the written error location pointer fails verification, using an error correction code to decode the error location pointer.

* * * * *